(12) United States Patent
Cheng et al.

(10) Patent No.: US 11,375,638 B2
(45) Date of Patent: Jun. 28, 2022

(54) IMMERSION COOLING APPARATUS

(71) Applicant: Wiwynn Corporation, New Taipei (TW)

(72) Inventors: Yuchun Cheng, New Taipei (TW); Ting Yu Pai, New Taipei (TW); Chih-An Liao, New Taipei (TW); Tsunglin Liu, New Taipei (TW); Pai-Chieh Huang, New Taipei (TW)

(73) Assignee: WIWYNN CORPORATION, New Taipei (TW)

( * ) Notice: Subject to any disclaimer, the term of this patent is extended or adjusted under 35 U.S.C. 154(b) by 0 days.

(21) Appl. No.: 16/896,349

(22) Filed: Jun. 9, 2020

(65) Prior Publication Data

US 2021/0219454 A1    Jul. 15, 2021

(30) Foreign Application Priority Data

Jan. 15, 2020  (TW) .................................. 109101389

(51) Int. Cl.
*H05K 7/20* (2006.01)

(52) U.S. Cl.
CPC ......... *H05K 7/203* (2013.01); *H05K 7/20318* (2013.01); *H05K 7/20818* (2013.01)

(58) Field of Classification Search
CPC ....................... H05K 7/20318; H05K 7/20818
USPC .................................................. 361/679.46
See application file for complete search history.

(56) References Cited

U.S. PATENT DOCUMENTS

| | | | | |
|---|---|---|---|---|
| 4,302,793 A | * | 11/1981 | Rohner | H05K 7/20272 174/15.1 |
| 4,704,658 A | * | 11/1987 | Yokouchi | H05K 7/203 165/104.33 |
| 4,949,164 A | * | 8/1990 | Ohashi | H01L 23/427 165/104.33 |
| 4,970,868 A | * | 11/1990 | Grebe | H01L 23/427 257/E23.088 |
| 5,297,621 A | * | 3/1994 | Taraci | G01R 31/2891 165/104.13 |
| 5,349,499 A | * | 9/1994 | Yamada | H01L 23/427 361/700 |
| 8,014,150 B2 | * | 9/2011 | Campbell | H05K 7/20809 361/700 |
| 10,143,113 B2 | * | 11/2018 | Shelnutt | F28D 15/02 |
| 10,512,192 B2 | * | 12/2019 | Miyoshi | H05K 7/20381 |
| 10,645,841 B1 | * | 5/2020 | Mao | H05K 7/20 |
| 10,999,951 B2 | * | 5/2021 | Tsunoda | H05K 7/20409 |

(Continued)

FOREIGN PATENT DOCUMENTS

CN         110470159 A         11/2019

OTHER PUBLICATIONS

Taiwan Patent Office, TW109101389, dated Oct. 26, 2020, Taiwan.
Taiwan Patent Office, "Office Action", dated Apr. 29, 2020, Taiwan.

*Primary Examiner* — Anatoly Vortman
(74) *Attorney, Agent, or Firm* — Locke Lord LLP; Tim Tingkang Xia, Esq.

(57) ABSTRACT

The disclosure relates to an immersion cooling apparatus configured to accommodate and cool at least one heat source. The immersion cooling includes a tank, a coolant, and at least one condenser. The coolant is accommodated in the tank and configured to direct thermal contact the at least one heat source. At least part of the at least one condenser is immersed in the coolant.

4 Claims, 6 Drawing Sheets

(56) References Cited

U.S. PATENT DOCUMENTS

| | | | | |
|---|---|---|---|---|
| 2017/0112017 A1* | 4/2017 | Wang | .................. | F28D 15/06 |
| 2017/0265336 A1* | 9/2017 | Ichinose | .................. | G06F 1/20 |
| 2017/0290205 A1* | 10/2017 | Shepard | .................. | H05K 7/20936 |
| 2017/0311484 A1* | 10/2017 | Ozyalcin | .................. | H05K 7/20645 |
| 2018/0246550 A1* | 8/2018 | Inaba | .................. | G06F 1/206 |
| 2019/0357379 A1* | 11/2019 | Kolar | .................. | H05K 7/20827 |

* cited by examiner

IMMERSION COOLING APPARATUS

CROSS-REFERENCE TO RELATED APPLICATIONS

This non-provisional application claims priority under 35 U.S.C. § 119(a) on Patent Application No(s). 109101389 filed in Taiwan (ROC) on Jan. 15, 2020, the entire contents of which are hereby incorporated by reference.

TECHNICAL FIELD

The disclosure relates to a cooling apparatus, more particularly to an immersion cooling apparatus.

BACKGROUND

With the rapid growth of technology, especially in the era that has large demand in internet, artificial intelligence, and cloud services, the data centers constantly need to process a massive amount of data. In order to maintain or improve the efficiency of the data centers. It is necessary to continuously and effectively remove heat generated by the data centers. As the power density of the data center increases, the conventional heat dissipation means would need to enhance power or be scaled up to deal with the increasing heat, however, these solutions are power-consuming and would greatly increase cost and impact on the environment.

Therefore, in recent years, liquid-cooling technologies, such as immersion cooling have gradually gained attention. Specifically, immersion cooling is to immerse heat sources, such as mainboard and other electrical components thereon, into a dielectric coolant, the coolant can be in thermal contact with these electrical components so that the immersion cooling is much more efficient than air cooling in terms of heat dissipation. Also, immersion cooling does not require fan or air-generating device, which helps reduce the power consumption, cost, operating noise, and requirement for space. With these advantages, immersion cooling gradually replaces air cooling.

Generally, the data center is always in operation, so the coolant is continuously heated and evaporated by the heat sources. This causes coolant vapor existing in the space above the coolant liquid. Thus, when every time the top cover of the equipment is opened to let the staff to repair or install/remove the electrical components, there will be a great amount of coolant vapor escaping through the opening to the outside, causing the loss of the coolant. Over time, the total amount of coolant will be continuously decreasing and thus affecting and reducing the cooling efficiency. Also, the dielectric coolant is very expensive, so the supplement of the lost coolant will result in considerable maintenance costs. In addition, the escaping dielectric coolant is known will cause harm to the environment and humans.

Although some have tried to increase the height of the coolant tank to make the coolant more difficult to escape, such an approach has been proved not effective and is a waste of space. Therefore, how to reduce the leakage of coolant vapor while the top cover is opened is an important issue to be solved in this field.

SUMMARY

One embodiment of the disclosure provides an immersion cooling apparatus configured to accommodate and cool at least one heat source. The immersion cooling includes a tank, a coolant, and at least one condenser. The coolant is accommodated in the tank and adapted to be in direct thermal contact with the at least one heat source. At least part of the at least one condenser is immersed in the coolant.

Another embodiment of the disclosure provides an immersion cooling apparatus configured to accommodate and cool at least one heat source. The immersion cooling includes a tank, a coolant, and at least one condenser. The coolant is accommodated in the tank and adapted to be in direct thermal contact with the at least one heat source. The at least one condenser is fully immersed in the coolant.

BRIEF DESCRIPTION OF THE DRAWINGS

The present disclosure will become better understood from the detailed description given hereinbelow and the accompanying drawings which are given by way of illustration only and thus are not intending to limit the present disclosure and wherein.

DETAILED DESCRIPTION

Figure 1:
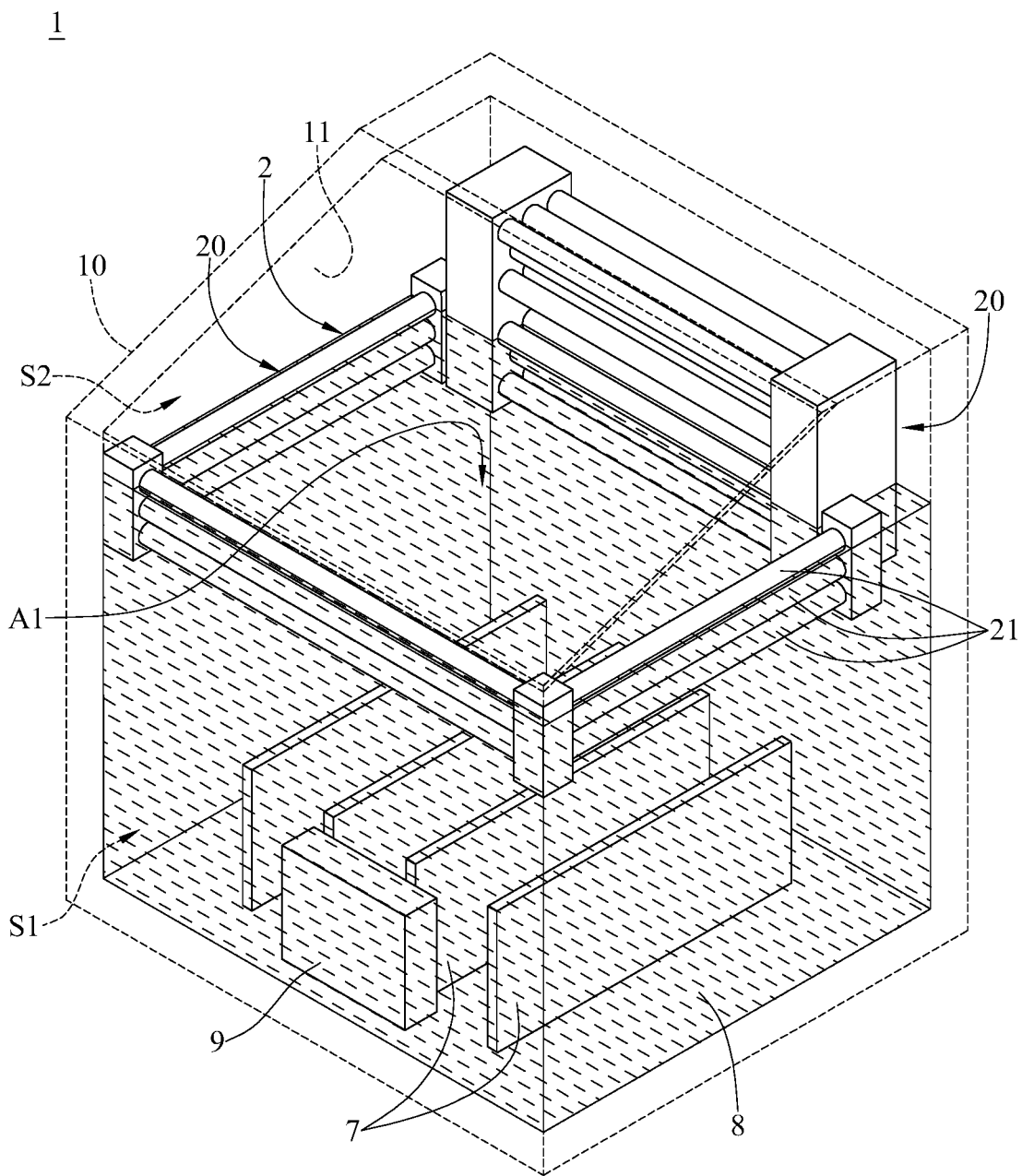
FIG. 1 is a perspective view of an immersion cooling apparatus according to one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details.

In addition, for the purpose of simple illustration, well-known features may be drawn schematically, and some unnecessary details may be omitted from the drawings. And the size or ratio of the features in the drawings of the present disclosure may be exaggerated for illustrative purposes, but the present disclosure is not limited thereto. Note that the actual size and designs of the product manufactured based on the teaching of the present disclosure may also be properly modified according to any actual requirement.

Further, as used herein, the terms "end", "part", or "area" may be used to describe a technical feature on or between component(s), but the technical feature is not limited by these terms. In addition, unless otherwise specified, the term "substantially" or "approximately" may be used herein to provide an industry-accepted tolerance to its corresponding term without resulting in a change in the basic function of the subject matter at issue.

Furthermore, unless otherwise defined, all the terms used in the disclosure, including technical and scientific terms, have their ordinary meanings that can be understood by those skilled in the art. Moreover, the definitions of the above terms are to be interpreted as being consistent with the technical fields related to the disclosure. Unless specifically defined, these terms are not to be construed as too idealistic or formal meanings.

Figure 2:
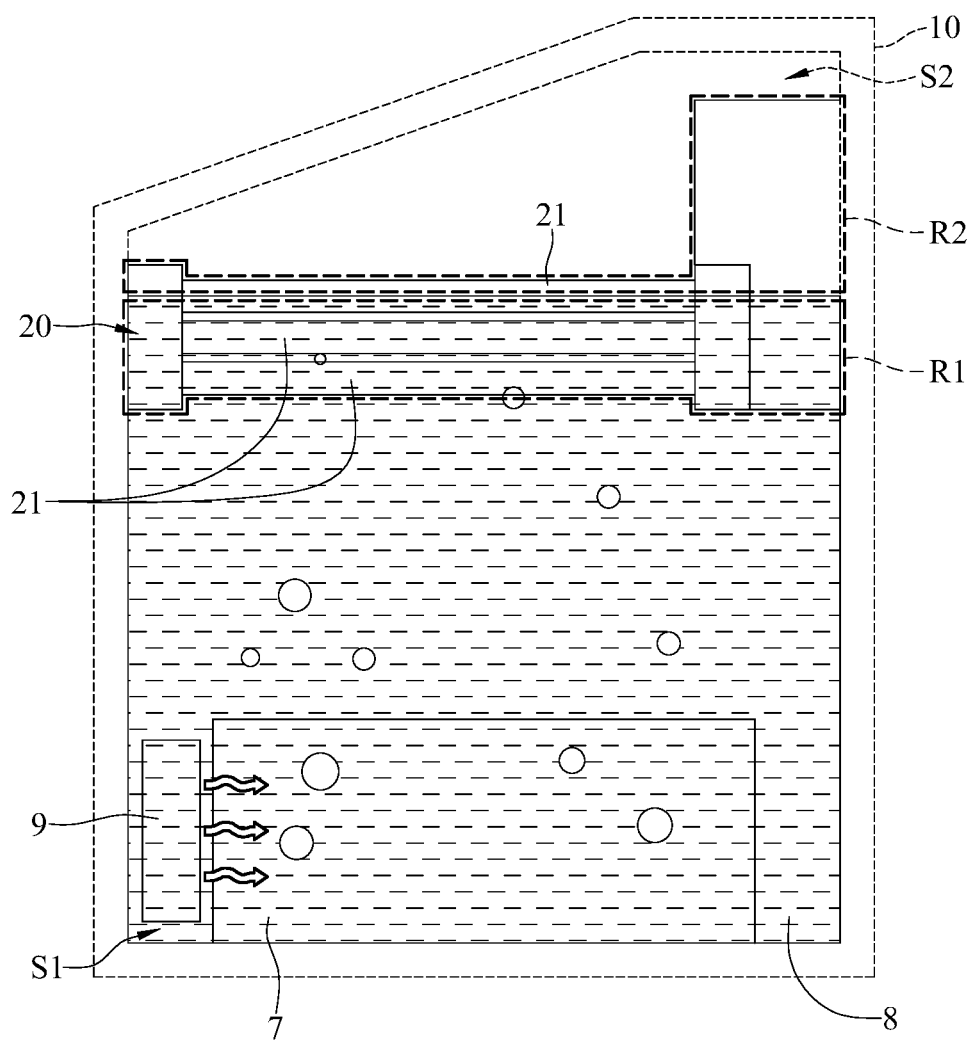
FIG. 2 is a side view of the immersion cooling apparatus in FIG. 1.
Figure 3:
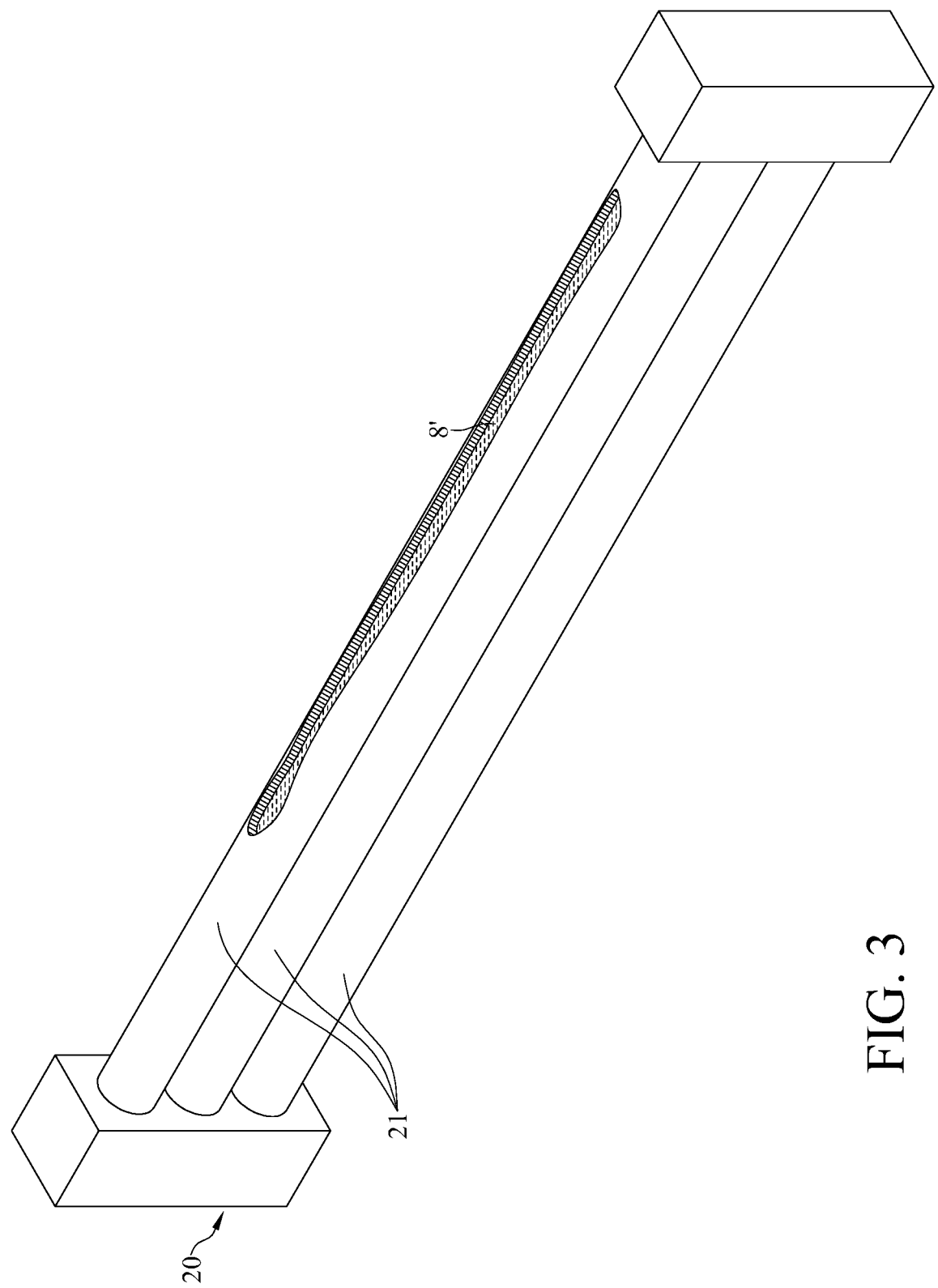
FIG. 3 is a perspective view of the condenser in FIG. 1.

Firstly, please refer to FIGS. 1-3, FIG. 1 is a perspective view of an immersion cooling apparatus 1 according to one embodiment of the disclosure, FIG. 2 is a side view of the immersion cooling apparatus 1 in FIG. 1, and FIG. 3 is a perspective view of a condenser 20 in FIG. 1. For the purpose of simple illustration, some components in the drawings may be shown in dotted-lines, and some components, such as electrical elements, pump, cable, and screws, may not be shown in the drawings. In this embodiment or some other embodiments, the immersion cooling apparatus 1 may include a tank or enclosure 10 and at least one condenser 20.

In this embodiment, the tank 10 is a hollow container with an openable top cover (not shown) at one end (e.g., top side), and the shape or the internal space (not numbered) of the tank 10 is polygonal, such as square, rectangular, and the like; however, the disclosure is not limited by the shape, size, thickness, and material of the tank 10. As shown, part of the internal space of the tank 10 is defined to be a liquid storage space S1, another part of the internal space is defined to be a vapor space S2. The said liquid storage space S1 particularly means an internal area in the tank 10 for accommodating liquid coolant 8, while the said vapor space S2 particularly means another internal area in the tank 10 above the liquid coolant 8 for the flowing of gaseous coolant or other gas, wherein at least one heat source 7 can be immersed in the coolant 8.

Note that the aforementioned heat source 7 is, but not limited to, one or more mainboards and/or other electrical/electronic elements or devices, and the disclosure is not limited by the heat source 7 and its type, quantity, size, scale, and components disposed thereon. Note that the aforementioned coolant 8, is, but not limited to, a dielectric fluid having a desired low boiling point and insulation. 3M™ Fluorinert™ Electronic Liquid FC-3284 may be implemented as the coolant 8 of the embodiment. The desired low boiling point of the coolant 8 may range between approximately 40 and 60 Celsius degrees or at least be lower than the working temperature of the heat source 7. Therefore, the coolant 8 is suitable for being in direct thermal contact with the heat source 7 for effectively and directly absorbing heat generated by the heat source 7; however, the disclosure is not limited by the coolant 8 and its type and physical properties.

As shown, in order to effectively dissipate heat for the heat source 7, the heat source 7 may be partially or fully immersed into the coolant 8 according to actual requirements. During the operation, the heat generated by the heat source 7 can cause the liquid coolant 8 to boil and turn it into gaseous coolant (or coolant vapor), such that the liquid coolant 8 will constantly be evaporated and flow towards the vapor space S2 (as the bubbles shown in FIG. 2).

In this embodiment and other embodiments, the condensers 20 are accommodated in the internal space of the tank 10. Specifically, at least one of the condensers 20 is partially located in the liquid storage space S1 to be partially immersed in the liquid coolant 8, and another part of the condenser 20 is located in the vapor space S2 to be located above the level of the liquid coolant 8 (may also simply called "coolant level"). More specifically, in this embodiment, each of the condensers 20 may have one or more condenser tubes 21, where the condenser tube 21 is a hollow cylinder of suitable material for transporting another coolant or working fluid. The condenser tube 21 can be called "heat pipe". Herein, FIG. 3 illustrates one of the condensers 20 with one of the condenser tubes 21 shown in a partial cross-sectional view so that the interior of the condenser tube can be seen. As shown, the condenser tube 21 may contain a working fluid 8' for absorbing and taking away the heat on the condenser tube 21. As discussed, the condenser 20 can be considered as an active heat dissipation device. In such an arrangement, the part of the condenser 20 immersed in the coolant 8 can cool the coolant 8 so as to form a relative cold liquid layer R1 having relatively low temperature in the liquid storage space S1; and another part of the condenser 20 located above the level of the liquid coolant 8 can cool the coolant vapor so as to form a condensing layer R2 in the vapor space S2.

As such, the coolant bubbles (not numbered) generated from the area near the heat source 7 and going upwards to near the coolant level (e.g., in the relative cold liquid layer R1) can be cooled by the condensers 20, such that the amount of the coolant bubbles evaporating from the coolant level will be considerably reduced, and thus which can reduce the amount of the coolant vapor existing in the vapor space S2. Therefore, when the top cover (not numbered) of the tank 10 is opened for user to repair or install/remove the heat source 7, the leakage of the coolant vapor through the opening (not shown) of the tank 10 will be effectively reduced, thereby reducing the effect of the coolant vapor leakage on the overall heat dissipation efficiency of the immersion cooling apparatus 1 and the cost on the supplement due to the leakage.

Herein, a Table 1 below records the temperatures of plural locations of the same height from the coolant level in terms of a half-immersed condenser and a fully-immersed condenser (referred to as "half-immersed" and "non-immersed" in Table 1), wherein the measurements were taken without considering heat loss. And the result of Table 1 can be used to determine the effect of the positions of the condenser on the coolant vapor distribution. Except for the location difference of the half-immersed and fully-immersed condensers, the other experimental conditions are substantially the same. Note that the higher the temperature measured at the same height, the larger the amount of the coolant vapor.

Comparing the results of the "non-immersed" and "half-immersed" in Table 1, at the same height, the temperatures measured in the case of "half-immersed" are all lower than that of the case of "non-immersed", this shows that the configuration of the "half-immersed" can much more effectively reduce the coolant vapor near the coolant level compared with the configuration of the "non-immersed". That is, as discussed in the aforementioned embodiment, the part of the condenser 20 immersed in the coolant 8 can cool the coolant 8 so as to form a relative cold liquid layer R1 having relatively low temperature in the liquid storage space S1, and another part of the condenser 20 located above the level of the liquid coolant 8 can cool the coolant vapor so as to form a condensing layer R2 in the vapor space S2, and thus the temperature of the coolant near the level can be effectively lowered so as to reduce the amount of the coolant bubbles evaporating from the coolant level.

TABLE 1

| | measurement points above liquid level | | | | |
| --- | --- | --- | --- | --- | --- |
| | 60 millimeters | 60 millimeters | 60 millimeters | coolant | heat source |
| | | | Temperature (° C.) | | |
| non-immersed | 41.47 | 42.75 | 44.68 | 50-51 | 80.8 |
| half-immersed | 39.89 | 37.565 | 38.495 | 41.5-44 | 79.2 |

Then, a Table 2 below records the temperature differences between inlet and outlet of the condenser in terms of cases of the "non-immersed" and "half-immersed" shown in Table 1. As shown, the temperature differences between inlet and outlet of the condenser in the "non-immersed" configuration is approximately 1.35 times that of the condenser in the "half-immersed" configuration. That is, the thermal efficiency of the condenser in the "non-immersed" configuration is approximately 1.35 times that of the condenser in the "half-immersed" configuration.

TABLE 2

|  | non-immersed | half-immersed |
| --- | --- | --- |
| temperature differences between inlet and outlet of the condenser (° C.) | 1.26 | 0.93 |

On the other hand, regarding the arrangement of the condensers 20, as shown in FIG. 1, the condensers 20 are arranged along an inner wall 11 of the tank 10 in a serial manner to form a polygonal structure 2 surrounding an empty central area A1 of the internal space of the tank 10. This arrangement also facilitates the maintenance and installation/removal of the heat source 7.

Figure 4:
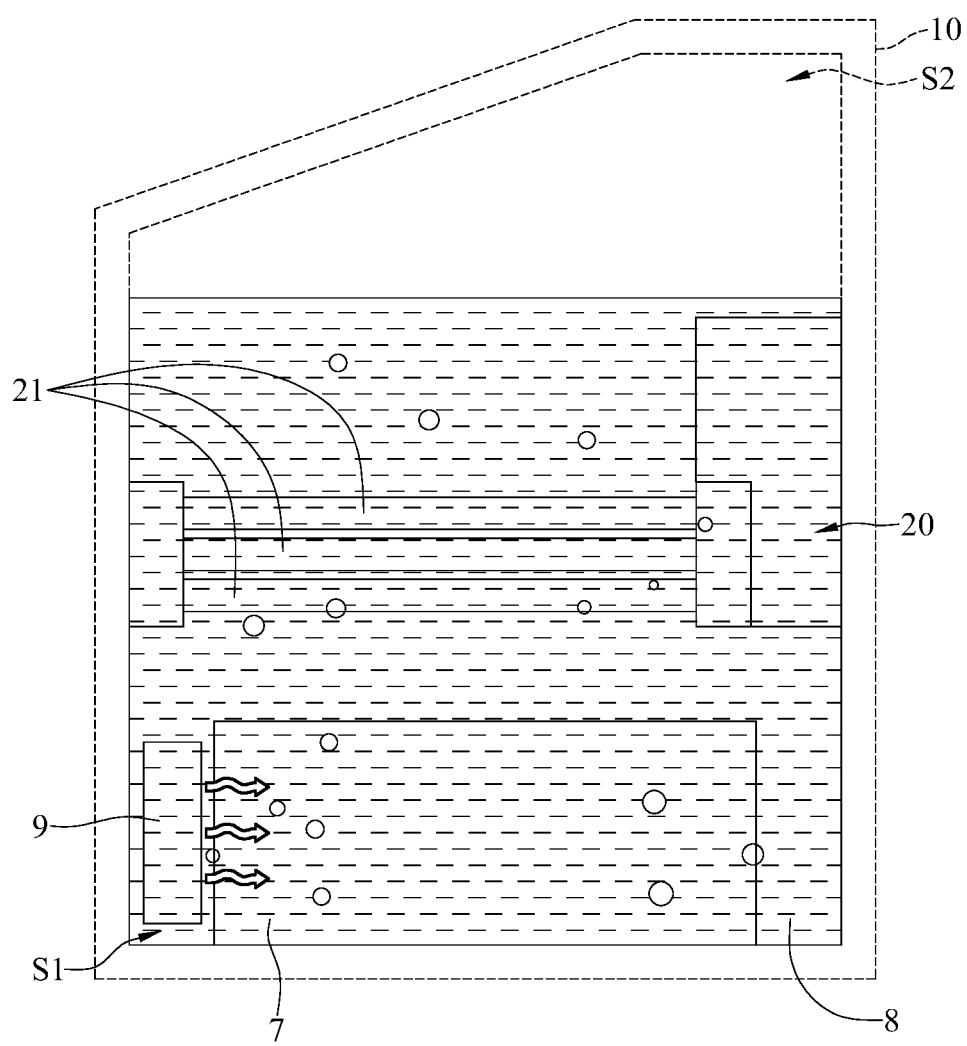
FIG. 4 is a side view of the immersion cooling apparatus FIG. 1 with the condenser fully immersed in the coolant.

Accordingly, it can be seen that immersing at least part of the condenser 20 into the liquid coolant 8 can help decrease the amount of the coolant bubbles evaporating from the coolant level. And the vertical distance between the coolant level and the bottom of the part of the condenser 20 being immersed in the coolant 8 may be adjusted according to actual requirements, such as the required heat dissipation efficiency, operation process, required reduction of evaporation, but the disclosure is not limited thereto. For example, please refer to FIG. 4, in one embodiment, the condensers 20 may be fully immersed in the coolant 8. Herein, note that in the arrangement that the condensers 20 are fully immersed in the coolant 8, as shown in FIG. 4, the condensers 20 can cool a larger amount of coolant 8, such that the amount of coolant bubbles evaporating from the coolant level can be further decreased.

Figure 5:
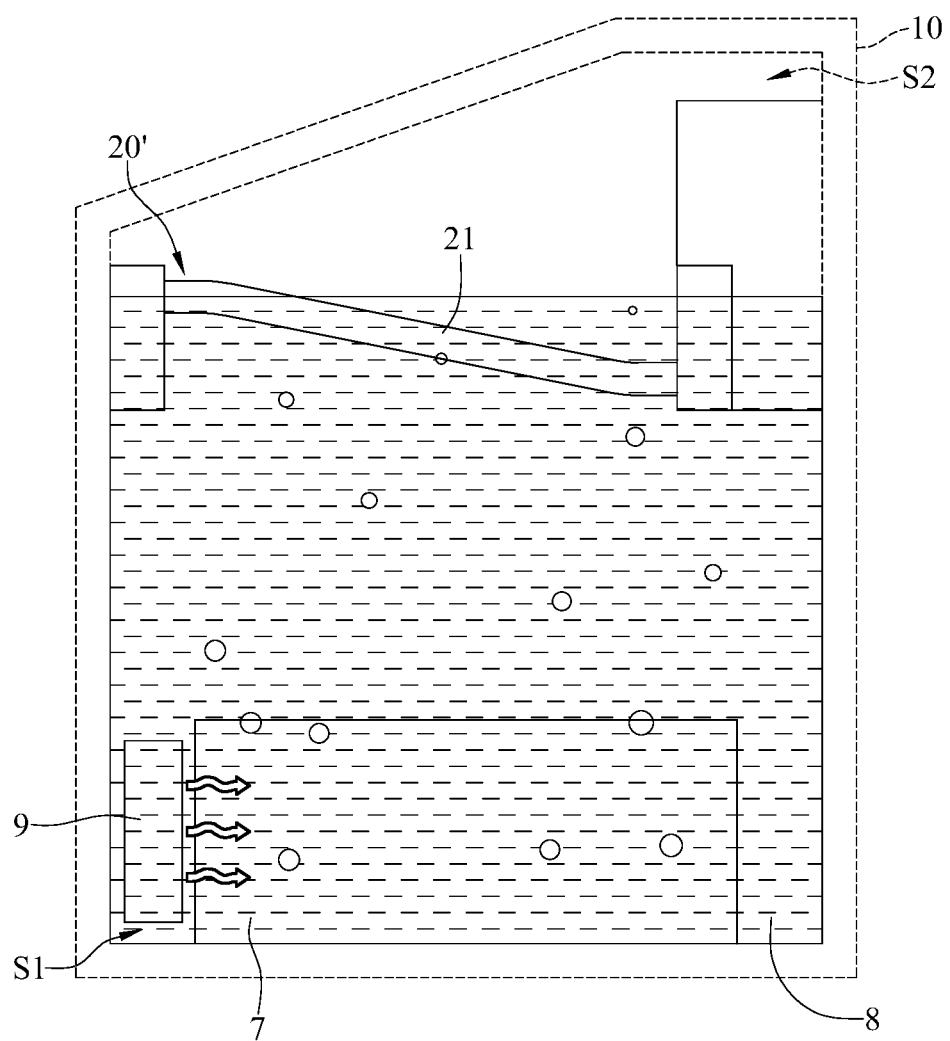
FIG. 5 is a side view of an immersion cooling apparatus according to another embodiment of the disclosure.
Figure 6:
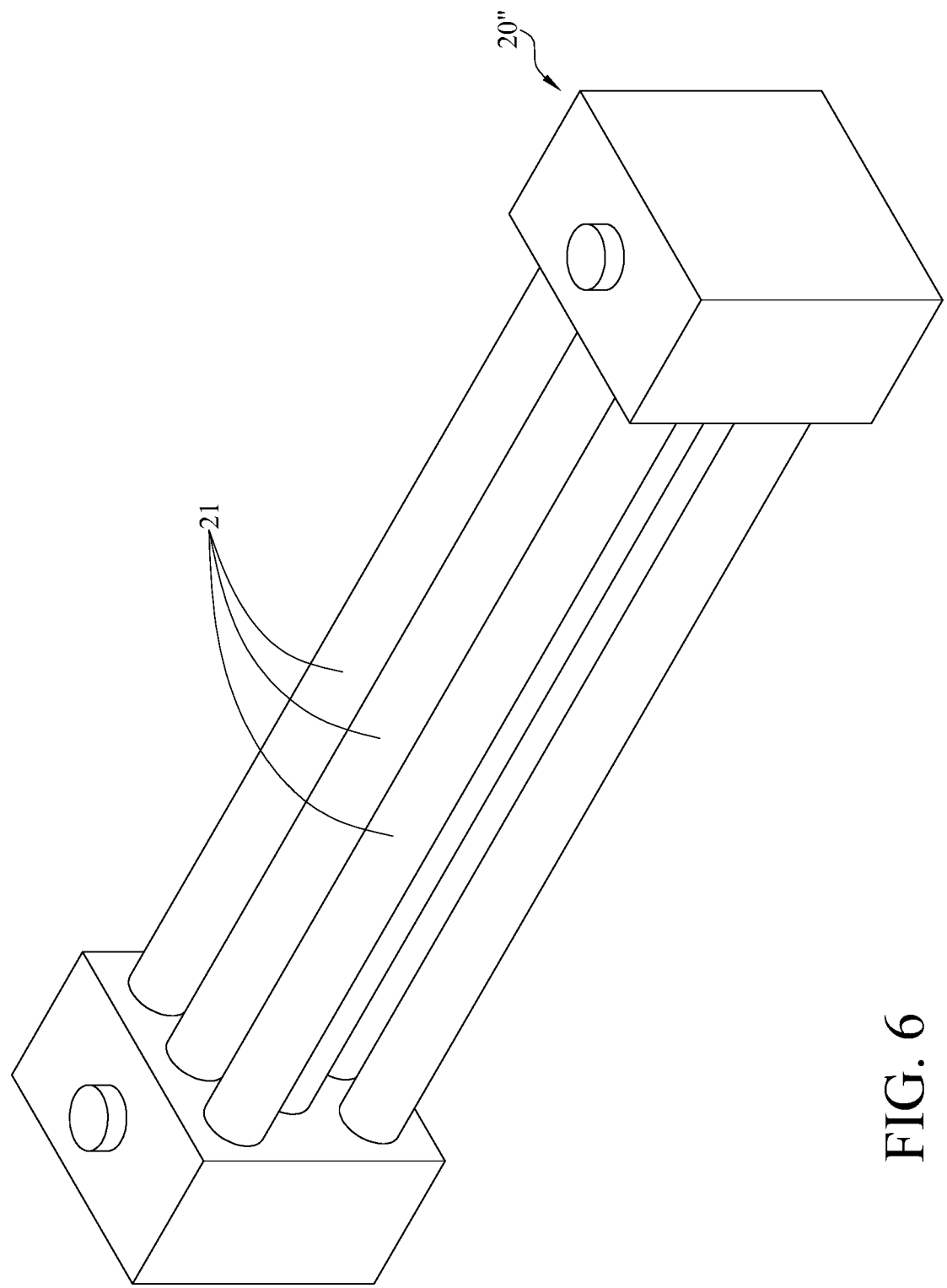
FIG. 6 is a perspective view of a condenser according to another embodiment of the disclosure.

Note that the condensers 20 shown in the drawings are for the comprehension of the embodiments of the disclosure, and the condensers 20 and their configurations, quantity, and positions are not intended to limit the disclosure. For example, referring to FIG. 5, in another embodiment, a condenser 20' of an immersion cooling apparatus 1' may only have a single condenser tube 21, the single condenser tube 21 may be partially immersed in the coolant 8, and this arrangement also can decrease the amount of coolant bubbles evaporating from the coolant level. Alternatively, referring to FIG. 6, a perspective view of a condenser 20" according to another embodiment of the disclosure is provided, where the condenser 20" may have more condenser tubes 21 than the condensers of the previous embodiments.

Furthermore, in one embodiment of the disclosure, the tank 10 may contain one or more turbulence generators to further improve the cooling efficiency.

Herein, as shown, the turbulence generator 9 may be located in the liquid storage space S1 and immersed in the liquid coolant 8, the turbulence generator 9 is, for example, a pump, a deformable metal plate by electricity, or any other suitable devices that can increase the disturbance of the coolant.

In the above embodiments, the turbulence generator 9 may generate a force to pressure part of the coolant 8 to flow towards the heat source 7 (as shown in the arrows), and thus which can accelerate the coolant 8 and the coolant bubbles (not shown) around the heat source 7 to make them flow through the heat source 7 in a faster manner, thereby further increasing the cooling efficiency. Note that the location and quantity of the turbulence generator 9 in the liquid storage space S1 are not particularly restricted and may be adjusted according to actual requirements.

According to the immersion cooling apparatus as discussed in the above embodiments of the disclosure, since at least part of the condenser is immersed in the coolant, the coolant bubbles generated from the heat source can be cooled at the area near the coolant level and thus reducing the amount of the coolant vapor being evaporated from the coolant level. Therefore, while the top cover of the apparatus is opened for the user to repair or install/remove the heat source in the apparatus, the leakage of the coolant vapor through the opening is effectively reduced, thereby reducing the effect of the coolant leakage on the overall heat dissipation efficiency and the cost on the supplement for coolant leakage.

In addition, according to test results, placing at least part of a condenser into the liquid coolant can help reduce 20% of the coolant vapor escaping from the opening of the apparatus while the top cover is opened.

It will be apparent to those skilled in the art that various modifications and variations can be made to the present disclosure. It is intended that the specification and examples be considered as exemplary embodiments only, with a scope of the disclosure being indicated by the following claims and their equivalents.

What is claimed is:

1. An immersion cooling apparatus, configured to accommodate and cool at least one heat source, comprising:
a tank;
a coolant, accommodated in the tank and adapted to be in direct thermal contact with the at least one heat source; and
a plurality of condensers, each comprising at least one heat pipe partially immersed in the coolant, wherein the plurality of condensers are respectively arranged at different inner walls of the tank and connected in serial manner to form a polygonal structure surrounding a central area of the tank so that the plurality of condensers are not vertically overlapping with the at least one heat source being arranged at the central area of the tank.

2. The immersion cooling apparatus according to claim 1, further comprising at least one turbulence generator, wherein the at least one turbulence generator is located in the tank and configured to increase a disturbance of the coolant.

3. An immersion cooling apparatus, configured to accommodate and cool at least one heat source, comprising:
a tank;
a coolant, accommodated in the tank and adapted to be in direct thermal contact with the at least one heat source; and
a plurality of condensers, each comprising at least one heat pipe fully immersed in the coolant, wherein the plurality of condensers are respectively arranged at different inner walls of the tank and connected in serial manner to form a polygonal structure surrounding a central area of the tank so that the plurality of condensers are not vertically overlapping with the at least one heat source being arranged at the central area of the tank.

4. The immersion cooling apparatus according to claim 3, further comprising at least one turbulence generator, wherein the at least one turbulence generator is located in the tank and configured to increase a disturbance of the coolant.

* * * * *